(12) United States Patent  (10) Patent No.: US 7,863,978 B1
Danielsons et al.  (45) Date of Patent: Jan. 4, 2011

(54) RF AMPLIFIER SYSTEM FOR NEUTRALIZING INTERNAL CAPACITANCE IN A CAVITY

(75) Inventors: David Christopher Danielsons, Maineville, OH (US); Geoffrey Norman Mendenhall, Cincinnati, OH (US)

(73) Assignee: Harris Corporation, Melbourne, CA (US)

( * ) Notice: Subject to any disclaimer, the term of this patent is extended or adjusted under 35 U.S.C. 154(b) by 0 days.

(21) Appl. No.: 12/557,565

(22) Filed: Sep. 11, 2009

(51) Int. Cl.
   *H03F 1/36* (2006.01)
(52) U.S. Cl. ............................. 330/79; 330/87; 330/94
(58) Field of Classification Search .................. 330/79, 330/87, 94
   See application file for complete search history.

(56) References Cited

U.S. PATENT DOCUMENTS 2,235,198 A * 3/1941 Buschbeck .................. 330/79
2,257,570 A * 9/1941 Posthumus ................... 330/77
3,382,450 A * 5/1968 Rockwell ..................... 330/77
3,617,915 A * 11/1971 Amemiya et al. ........... 330/292
3,835,406 A * 9/1974 Thompson ................... 330/292

* cited by examiner

*Primary Examiner*—Patricia Nguyen
(74) *Attorney, Agent, or Firm*—Tarolli, Sundheim, Covell & Tummino LLP

(57) ABSTRACT

An RF amplifier system having closed cavity containing an amplifying device that includes at least a cathode, an anode and a grid and wherein the amplifying device exhibits an internal grid-to-anode capacitance. Apparatus is presented for use in neutralizing the internal capacitance. This includes a feedback circuit including an external capacitor of fixed value and a phase inverting transformer having a transformer primary winding connected in series with the capacitor to the cathode. The transformer has a secondary winding connected between the cathode and the grid for supplying a phase inverted negative feedback voltage to the grid for neutralizing the cavity by the feedback voltage. The transformer coupling is adjustable to vary the magnitude of the feedback voltage.

10 Claims, 2 Drawing Sheets

RF AMPLIFIER SYSTEM FOR NEUTRALIZING INTERNAL CAPACITANCE IN A CAVITY

FIELD OF THE INVENTION

This invention is directed to RF broadcast transmission and communication systems in general and is particularly related to improving the stability and efficiency of radio frequency power amplifiers.

BACKGROUND OF THE INVENTION

In an RF broadcast transmitting system, such as a VHF FM transmitter, employing tubes, considerable time may be spent during the set-up operation for neutralizing the cavity. The cavity is an enclosed cavity that contains the transmitting tube, such as a tetrode. Such a tube employs at least a cathode, an anode and a grid. The tube exhibits an internal grid to anode capacitance which provides an error factor during the operation. Consequently, it is important during the set-up procedure to neutralize this internal capacitance and this is frequently referred to as neutralizing the cavity.

It is common to employ feedback capacitors extending from the anode to the primary of a transformer, the secondary of which applies an opposing voltage to the grid for the purposes of neutralizing the cavity. This is a time consuming procedure because entry must be gained into the cavity in order to adjust the feedback capacitors therein and then closing the cavity and making a measurement. This process is repeated several times until satisfactory results towards gaining neutralization are obtained.

Other approaches to gain cavity neutralization have included adjusting screen inductance. This also requires entry into the cavity.

It is desirable, therefore, to obtain cavity neutralization in a manner that is external to the cavity and thereby reduce off air time and manufacturing expenses. Such a method of neutralization would be more stable over time than such prior art methods of adjusting the feedback capacitance.

In addition to the features noted above, the present invention minimizes dirt collection and arcing problems that have been associated with neutralization methods, thus far employing variable capacitors. Additionally, the invention places the anode sampling capacitors at DC ground potential and this will protect the control grid in the event of plate arcing. Also, the invention minimizes the need to add a high current, capacitor divider at the ground end of the grid tuning inductors which may drift in value during warm-up operation. The inventive approach allows the neutralization technique to be adjusted from outside the cavity without disturbing the cavity resonance. Tube changes can be made quickly and manufacturing test time can be greatly reduced employing the invention.

SUMMARY OF THE INVENTION

In accordance with one aspect of the present invention, an RF amplifier system is presented that employs an enclosed cavity containing an amplifier device that includes at least a cathode, an anode and a grid wherein the amplifying device exhibits an internal grid to anode characteristic capacitance. The invention employs an apparatus for neutralizing the internal capacitance. This includes a feedback circuit that includes an external capacitor of fixed value together with a phase inverting transformer having a transformer primary winding connected in series from the capacitor to the cathode. This transformer employs a secondary winding connected between the cathode and the grid for purposes of supplying a phase inverted negative feedback voltage to the grid for purposes of neutralizing the internal capacitance of the cavity.

In accordance with another aspect of the present invention, the external capacitor is located in the cavity and the transformer coupling between the primary winding and the secondary winding is adjustable for adjusting the value of the feedback voltage supplied to the grid.

Still further in accordance with the invention, the transformer coupling includes one of the transformer windings.

In accordance with a still further aspect of the present invention the transformer coupling includes the primary winding of the transformer and this winding is adjustable.

In accordance with a still further aspect of the present invention, the adjustable primary winding includes a tapped primary winding.

In accordance with a still further aspect of the present invention, the transformer coupling employs a strip line transformer.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF PREFERRED EMBODIMENTS

Figure 1:
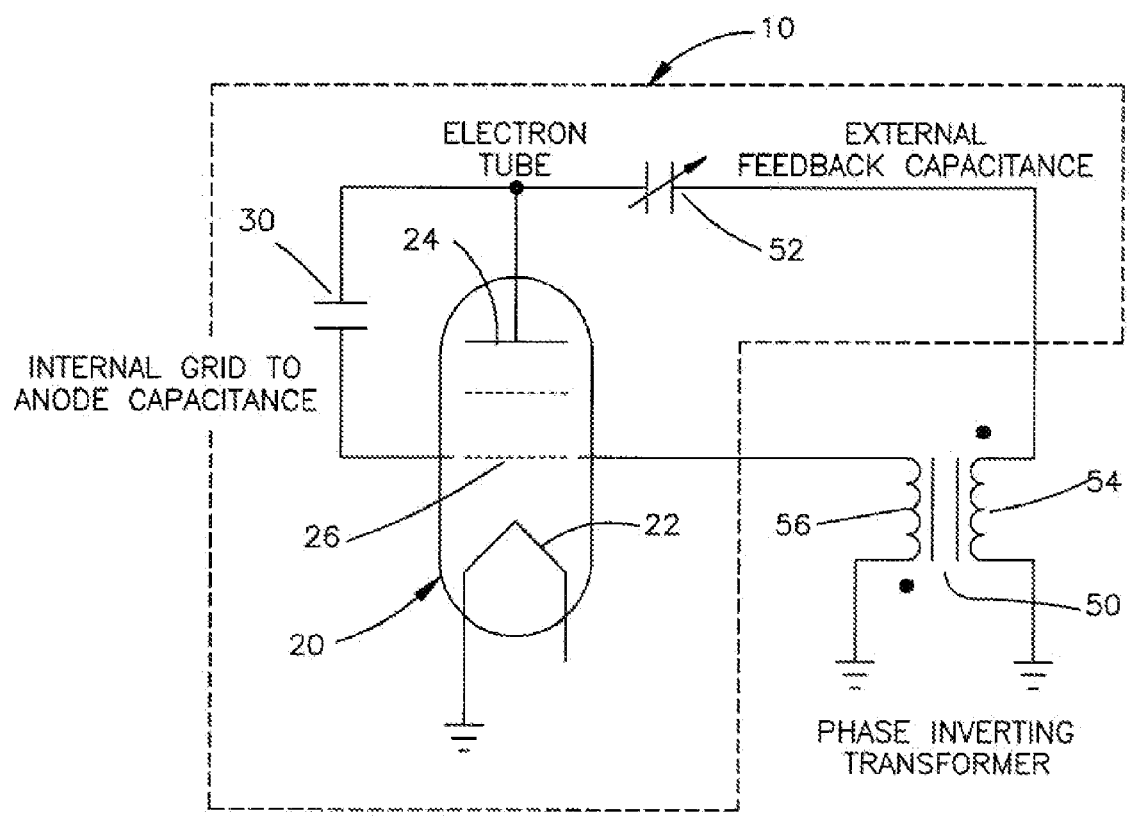
FIG. 1 is a schematic circuit diagram illustrating relevant prior art.

The present invention is directed toward improvements to an RF amplifier system such as those employed in broadcasting RF signals. Such a system employs an amplifying device that is located in an enclosed resonant cavity. Such a cavity is illustrated in the prior art of FIG. 1 and includes a cavity 10. As is known, a resonant cavity or cavity resonator may be defined as any region bounded by conducting walls within which resonant electromagnetic fields may be excited. Thus, the cavity 10 is bounded by conducting walls so as to provide a container within which the cavity contains an amplifying device 20. This amplifying device includes a cathode 22, an anode 24 and a grid 26. An internal grid-to-anode capacitance is illustrated in FIG. 1 as capacitance 30. During operation of the amplifying device, a voltage builds up across this internal capacitance and this serves as an error factor. To neutralize or compensate for this error factor, a negative feedback is supplied by means of the secondary winding of a transformer 50. This transformer has its primary winding connected in series with a variable capacitor 52 between ground and the anode 24. The secondary winding supplies the grid 26 with an inverted opposing voltage to neutralize the voltage built up at the internal grid-to-anode capacitance. This is achieved by employing the circuit as illustrated, including the variable capacitance 52 connected in series with the primary winding 54 of transformer 50. The secondary winding 56 of the transformers supplies the inverting opposing voltage to the grid 46. The prior art requires that the external capacitor 52 be adjusted. To achieve this, entrance must be obtained into the cavity 10. The cavity is typically a metal container having entrance by means of a door that is fastened to the periphery of a hole located in a sidewall of the metal container. This typically may require bolting and unbolting a plurality of screws or bolts and the like, all of which takes considerable time. This doorway will be opened and then closed and a measurement will be made as to the level of voltage in the cavity at the capacitance 30. This process will be repeated until satisfactory results are obtained in neutralizing the cavity.

As will be noted from the discussion that follows, the invention herein employs neutralization of the cavity by making adjustments outside of the cavity without disturbing the cavity resonance and, hence, tube changes can be made quickly and manufacturing test time can be greatly reduced. Reference is now made to the embodiments of the invention illustrated in FIGS. 2 and 3. These two embodiments employ circuitry located externally of the cavity 10 and, consequently, adjustments can be made in the magnitude of the negative feedback voltage applied to the grid of the amplifying device without disturbing the cavity resonance.

Figure 2:
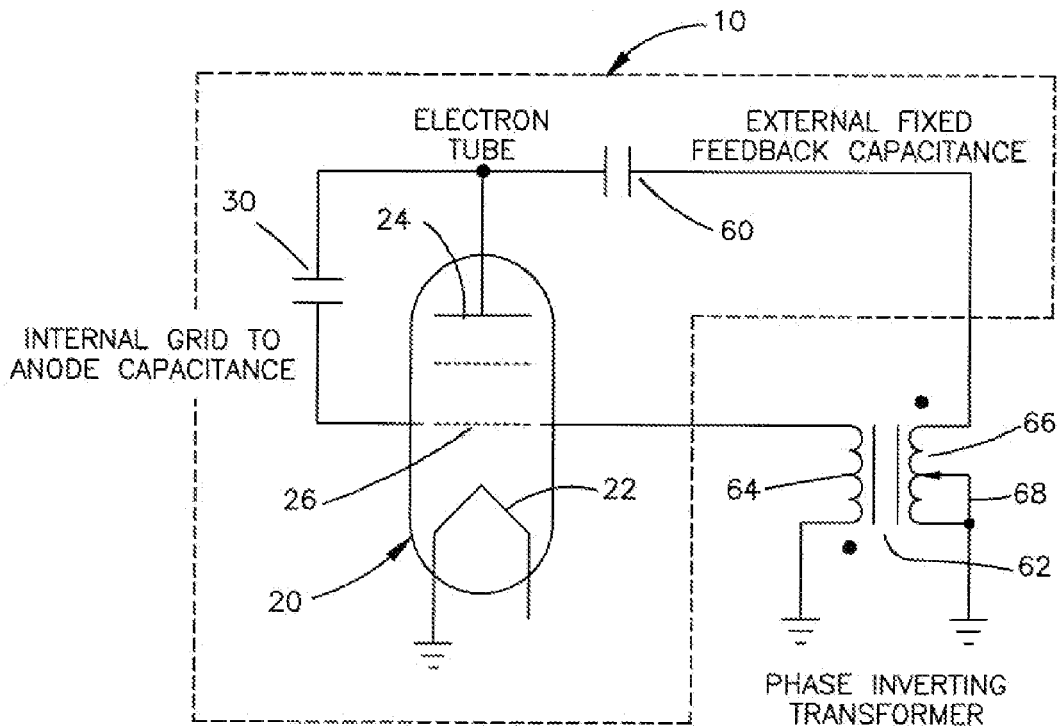
FIG. 2 is a schematic circuit diagram illustrating a first embodiment of the present invention.

Reference is now made to FIG. 2 which presents circuitry similar to that as illustrated in FIG. 1 and, consequently, like components are identified with like character references. Only the differences in the circuitry of FIG. 2 will be described in detail below.

It is to be initially noted that this embodiment of the invention incorporates a small fixed capacitance capacitor 60 which couples a small amount of energy directly off the tube anode 24. This voltage sample is then scaled and inverted by a transformer 62. This transformer has a secondary winding 64 that supplies a 180° phase shift voltage to the grid 26. This voltage is adjusted with an adjustable primary winding 66 having an adjustable center tap 68. The adjustment is made so as to be equal and opposite to the voltage coupled through the anode to the grid capacitor 30.

It is to be particularly noted that in this embodiment the transformer primary is adjustable and is located external to the cavity 10. Consequently, adjustment of the feedback voltage can be made easily outside the cavity.

By adjusting the turns ratio of the transformer, the amount of negative feedback can be adjusted. This allows the feedback capacitor 60 to be a fixed value and entrance into the cavity 10 to adjust the feedback voltage is not employed.

Figure 3:
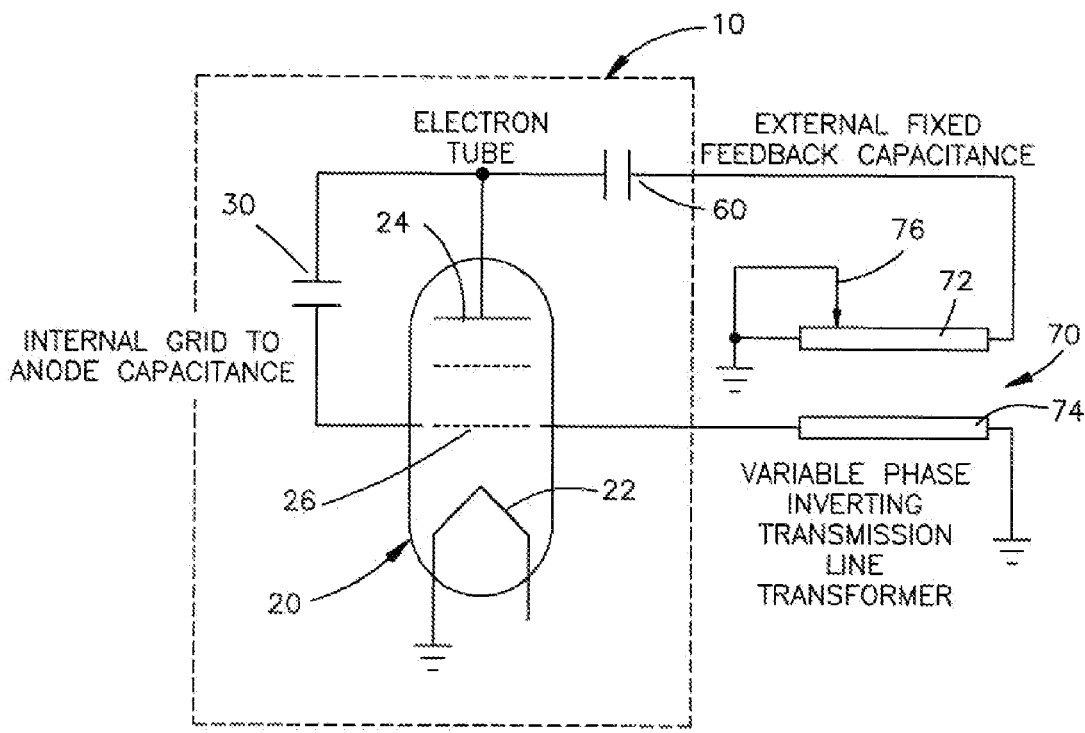
FIG. 3 is a circuit diagram illustrating a second embodiment of the present invention.

Reference is now made to FIG. 3 which illustrates a second embodiment of the invention. In this embodiment, the various circuit components that are similar to those in FIG. 1, are identified with like character references. Only the differences in the two circuits are described herein in detail.

This embodiment is similar to that of the embodiment of FIG. 2, but it is intended for use at higher frequencies, such as VHF frequencies, and employs a strip line transformer 70. This transformer includes a primary strip 72 and a secondary strip 74. The primary strip 72 employs a sliding short 76 to adjust the value of the feedback voltage supplied to the grid 26. This feedback voltage is of opposite polarity to that of the voltage across the internal capacitance 30.

It is to be noted that in the two embodiments of FIGS. 2 and 3, the adjustable transformer winding is illustrated as being on the primary side of the transformer. This could also be obtained by providing the adjustable transformer winding on the secondary of the transformer.

Although the invention has been described in conjunction with preferred embodiments, it is to be appreciated that various modifications may be made without departing from the spirit and scope of the invention as defined by the appended claims.

Having described the invention, we claim:

1. An RF amplifier system having closed cavity containing an amplifying device that includes at least a cathode, an anode and a grid and wherein said amplifying device exhibits an internal grid-to-anode capacitance, apparatus for use in neutralizing said internal capacitance comprising:
   a feedback circuit including an external capacitor of fixed value and a phase inverting transformer having a transformer primary winding connected in series with said capacitor to said cathode, said transformer having a secondary winding connected between said cathode and said grid for supplying a phase inverted negative feedback voltage to said grid for neutralizing said cavity by said feedback voltage.

2. A system as set forth in claim 1 wherein said transformer coupling between said primary and secondary windings is adjustable for adjusting the value of said feedback voltage.

3. A system as set forth in claim 1 wherein said coupling includes one of said transformer windings.

4. A system as set forth in claim 3 wherein said coupling includes an adjustable transformer winding as one of said transformer windings.

5. A system as set forth in claim 4 wherein said adjustable transformer winding includes said winding having a tapped primary winding and wherein said primary winding includes a movable tap.

6. A system as set forth in claim 1 wherein said fixed value capacitor in said feedback circuit is included within said cavity.

7. A system as set forth in claim 1 wherein said transformer is located outside of said cavity.

8. A system as set forth in claim 1 wherein said transformer is a variable phase transmission line transformer.

9. A system as set forth in claim 8 wherein said fixed value capacitor in said feedback circuit is included within said cavity.

10. A system as set forth in claim 9 wherein said transformer is located outside of said cavity.

* * * * *